United States Patent [19]
Eisele et al.

[11] 4,017,884
[45] Apr. 12, 1977

[54] MAGNETIC FIELD SENSITIVE DIODE AND METHOD OF MAKING SAME

[75] Inventors: Ignaz Eisele, Ottobrunn; Hans Pfleiderer; Ekkehard Preuss, both of Munich, all of Germany

[73] Assignee: Siemens Aktiengesellschaft, Berlin and Munich, Germany

[22] Filed: May 4, 1976

[21] Appl. No.: 683,208

Related U.S. Application Data

[63] Continuation of Ser. No. 496,558, Aug. 12, 1974, abandoned.

[30] Foreign Application Priority Data

Aug. 13, 1973 Germany .......................... 2340895

[52] U.S. Cl. ..................... 357/27; 357/55; 357/58; 357/63; 307/308; 307/309
[51] Int. Cl.² ................. H01L 27/22; H01L 29/82; H01L 29/96; H01L 43/00
[58] Field of Search .................. 357/27, 55, 58, 63; 307/308, 309

[56] References Cited
UNITED STATES PATENTS

| | | | |
|---|---|---|---|
| 3,272,668 | 9/1966 | Miller et al. | 357/30 |
| 3,374,124 | 3/1968 | Tavendale | 357/27 |
| 3,461,005 | 8/1969 | Jamini | 357/30 |
| 3,553,498 | 1/1971 | Xamada | 357/27 |
| 3,553,540 | 1/1971 | Puterbaush | 357/27 |
| 3,612,869 | 10/1971 | Baum | 357/30 |
| 3,911,468 | 10/1975 | Fujikawa | 357/27 |

FOREIGN PATENTS OR APPLICATIONS 1,285,996   8/1972   United Kingdom ................ 357/27

*Primary Examiner*—Andrew J. James
*Attorney, Agent, or Firm*—Hill, Gross, Simpson, Van Santen, Steadman, Chiara & Simpson

[57] ABSTRACT

A magnetic field sensitive diode including a silicon body, an n-injecting contact electrode and a p-injecting contact electrode located at spaced portions of the body, the body having opposed parallel surfaces having different recombination rates with respect to pairs of free charge carriers, the surface having the lower recombination rate consisting of silicon dioxide, the n-injecting contact electrode consisting of diffused in lithium, with substantially all of the acceptors in the silicon body being compensated by incorporated lithium ions, the silicon dioxide surfaces being essentially free of lithium. The invention also relates to a method of producing the improved structure.

7 Claims, 1 Drawing Figure

U.S. Patent      April 12, 1977      4,017,884
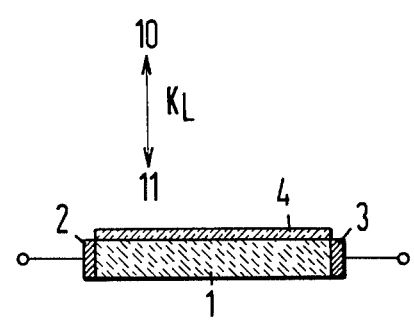

MAGNETIC FIELD SENSITIVE DIODE AND METHOD OF MAKING SAME

This is a continuation of application Ser. No. 496,558, filed Aug. 12, 1974 and now abandoned.

BACKGROUND OF THE INVENTION

1. Field of the Invention

This invention is in the field of diodes which are sensitive to magnetic fields, the diode having a body of silicon, and p-injecting and n-injecting contact electrodes, the n-injecting electrode being lithium, and the p-injecting electrode preferably being aluminum.

2. Description of the Prior Art

A magnetic sensitive silicon diode has been described in the article by Arai et al, entitled "Silicon Magnetodiode" published in the Proceedings of the Second Conference on Solid State Devices, (Tokyo 1970). A similar diode composed of germanium has been described in "Radio Mentor" Vol. 34 (1968) No. 4, pages 200 to 202. Diodes of this type have a surface of particularly high recombination speed which is achieved by introducing impurities into the surface.

The magnetic field sensitivity of such diodes is based upon the so-called Lorentz force: moving electrical charges are deflected from their original path by a magnetic field whose direction is perpendicular to the direction of motion of the charges, the deflection taking place in a direction which is perpendicular to the original direction of motion and perpendicular to the direction of the field.

If a diode of this type is biased in the forward direction, then the n-charge carriers move in the electric field from the n-injecting electrode to the p-injecting electrode, while the p-charge carriers move in the reverse direction. A magnetic field can be set up which, because of the Lorentz force, causes the charge carrier pairs to be deflected either in the direction toward the surface having a high rate of recombination, or in the direction toward a surface having a lower recombination rate. In the first instance, the magnetic field reduces the number of free charge carrier pairs while in the second case, the number is increased. The latter case corresponds to a negative magneto resistance, i.e., the magnetic field reduces the resistance in the forward direction while the former case corresponds with positive magneto resistance, i.e., the magnetic field increases the forward resistance. Where very strong magnetic fields are used, the Lorentz force is so large that the resistance increases within increasing magnetic field, whichever of the two magnetic field polarizations is employed, but to different extents, i.e. the magneto resistance is always positive. The magnetic field sensitivity of the diode is not impaired.

SUMMARY OF THE INVENTION

This invention provides a diode sensitive to a magnetic field, and having a high sensitivity. It consists of a silicon body and an n-injecting contact electrode and a p-injecting contact electrode located at spaced portions of the body. The silicon body has opposed parallel surfaces having different recombination rates with respect to pairs of free charge carriers. Typically, one of the surfaces consists of silicon dioxide, while the other is a preferably roughened free silicon surface. The n-injecting electrode consists of diffused in lithium while the p-injecting contact is preferably diffused or alloyed in aluminum.

The invention is believed to be based upon the following analysis. If high purity silicon is produced, because of the impurities characteristic of most growing processes, p-conducting silicon is obtained. In order to obtain intrinsically conducting silicon, the residual acceptors which are present are compensated with lithium ions. Automatic compensation is achieved by virtue of the fact that by biasing a p+ p—n+ diode in the reverse direction, the lithium ions are caused to drift from the n-contact, by the applied electric field, into the p-zone of the diode. Consequently, the specific resistance of the silicon increases to an extraordinary extent, rising from about 1000 ohm centimeters to values in excess of 100,000 ohm centimeters. Consequently, the theoretically calculated intrinsic resistance of pure silicon is approached very closely.

A silicon dioxide-silicon interface has a particularly low recombination rate with relation to the charge carrier pairs. The rate is about 10 to 100 centimeters per second. It is advantageous, furthermore, that this property is not destroyed either by aging effects or by thermal influences.

The present invention utilizes a high temperature process for manufacturing silicon dioxide surfaces by thermal oxidation and this reduces the bulk lifetime of the free charge carrier pairs in the silicon to a drastic extent. This results in a very short free diffusion length on the part of the free charge carriers. The diffusion length is given by the equation:

$$L = \sqrt{Dt}$$

where L is the diffusion lenth, D is the diffusion constant of the carriers and $t$ is their lifetime. In the special case of the diode of the present invention, L is the bipolar diffusion length which applies to n-p charge carrier pairs and D is the bipolar diffusion constant. The switching speed of the diode depends essentially upon the lifetime $t$ and because of the thermally oxidized surface, a particularly high switching speed is obtained.

In a preferred embodiment of the present invention, surfaces of the silicon body having different recombination rates with respect to the charge carrier pairs are separated from each other by a distance corresponding substantially to the diffusion length.

In another preferred embodiment of the present invention, one of the surfaces of pure silicon which has a high recombination rate is roughened or implanted with non-doping ions. This has the advantage of still further increasing the recombination rate so that the magnetic field sensitivity of the diode is improved to an even greater extent.

BRIEF DESCRIPTION OF THE DRAWING

Other objects, features and advantages of the invention will be readily apparent from the following description of a preferred embodiment thereof, taken in conjunction with the accompanying drawing, although variations and modifications may be effected without departing from the spirit and scope of the novel concepts of the disclosure, and in which:

The single FIGURE of the drawing is a greatly enlarged cross-sectional view of a diode produced according to the present invention.

DESCRIPTION OF THE PREFERRED EMBODIMENTS

Reference numeral 1 has been applied to a block of silicon, provided with an n-injecting electrode 2 produced by the diffusion therein of lithium, and a p-injecting electrode 3 produced by alloying of aluminum therein. One surface 4 of the block is covered with thermally produced silicon dioxide and this surface is in opposed parallel spaced relationship with an unoxidized, preferably roughened free silicon surface. If the n-injecting electrode is connected to a negative electrical potential and the p-injecting electrode to a positive potential, the diode is biased in the forward direction. The double arrow $K_L$ refers to the direction of the Lorentz force on displaced charges with application of a corresponding magnetic field. If a magnetic field is applied in such a way that the Lorentz force has the direction 10, then a negative magneto resistance effect is obtained, while in the direction 11, it produces a positive magneto resistance effect.

In accordance with a modification of the present invention, one or more field electrodes can be applied between the p- and n-contacts in line with the current path to influence the forward behavior of the diode. By the application of an electrical potential, to this field electrode, there is a change in the effective surface recombination rate. Thus, the diode of the present invention can be controlled through two mutually independent parameters.

To compensate for the n-charge carriers in the silicon, a known type of lithium drift process is carried out. During this process it has to be ensured that the lithium ions do not enter the silicon dioxide layer 4. Otherwise, they would produce an undesirably large increase in the recombination rate in respect of free pairs of charge carriers in the silicon dioxide surface and, as fixed charges, would influence charge carriers in the silicon.

One process for producing the diodes of the present invention involves first cutting a piece of silicon into blocks and lapping and polishing the blocks. The blocks are then oxidized at their surfaces at temperatures of about 1200° C to produce silicon dioxide. Two mutually opposite surfaces are then etched and thus freed from the oxide. A p-injecting electrode is produced by vapor deposition of aluminum with subsequent alloying at temperatures of about 600 to 800° C under high vacuum. The n-injecting electrode is generated by applying lithium and subsequently carrying out a diffusion at about 350° to 450° C. After formation of these electrodes, a voltage is applied in the reverse direction and the block is heated to about 120° C. Under these conditions, lithium ions drift from the n electrode to the p electrode through the block. During this drift through the block, an additional electric field is applied which is such that the lithium ions are prevented from penetrating into at least one of the surfaces of the block of silicon dioxide.

Preferably, planar and parallel field electrodes consisting of metal are used to generate the additional fields. Between the silicon dioxide surface and the field electrode a dielectric such as a foil of polyetrafluoroethylene, mica or polyethylene terephthalate can be interposed, the thickness of the dielectric being such that the applied field effect voltage is higher than the voltage required for the drift mechanism. In other words, at all points on the oxidized surface there must be a potential difference so that the lithium ions are unable to penetrate into the oxide layer 4. The potential profile along the drift direction is particularly critical. The potential on the field effect electrode must be higher than the highest potential prevailing in the silicon. The capacitively applied voltage acts at the interface between the silicon dioxide and the silicon to produce an electric field penetrating into the silicon. The sign and the magnitude of this field are so chosen that the lithium ions on the one hand drift undisturbed in the electric field between the contact electrodes, and on the other hand cannot penetrate into the oxide.

It should be evident that various modifications can be made to the described embodiments without departing from the scope of the present invention.

We claim as our invention:

1. A magnetic field sensitive diode comprising a silicon body, an n-injecting contact electrode and a p-injecting contact electrode located at spaced portions of said body, said electrodes being capable of producing n charges and p charges respectively in said body, said body having opposed parallel surfaces having different recombination rates with respect to pairs of free charge carriers, the surface having the lower recombination rate consisting of silicon dioxide formed by means of thermal oxidation and extending between said electrodes and parallel to the current path through said diode, said n-injecting contact electrode consisting of diffused in lithium, with substantially all of the acceptors in the silicon body being compensated by incorporated lithium ions, the silicon dioxide surface being free of lithium.

2. A diode according to claim 1 in which the p-injecting contact is diffused in aluminum.

3. A diode according to claim 1 in which the p-injecting contact is alloyed in aluminum.

4. A diode according to claim 1 in which said opposed parallel surfaces are separated by substantially a diffusion length of n- and p-type charge carriers in the silicon body.

5. A diode according to claim 1 in which the silicon surface opposite to the silicon dioxide surface is roughened.

6. A diode according to claim 1 in which the silicon surface opposite to the silicon dioxide surface is implanted with non-doping ions.

7. A diode according to claim 1 which includes at least one field electrode along the current path in said body.

* * * * *